(12) United States Patent
Stengel et al.

(10) Patent No.: US 6,819,181 B2
(45) Date of Patent: Nov. 16, 2004

(54) METHOD AND STRUCTURE FOR INTEGRATED CIRCUIT INTERFERENCE ISOLATION ENHANCEMENT

(75) Inventors: Robert E. Stengel, Pompano Beach, FL (US); Bruce M. Thompson, Boca Raton, FL (US)

(73) Assignee: Motorola, Inc., Schaumburg, IL (US)

( * ) Notice: Subject to any disclaimer, the term of this patent is extended or adjusted under 35 U.S.C. 154(b) by 389 days.

(21) Appl. No.: 10/036,550

(22) Filed: Dec. 21, 2001

(65) Prior Publication Data

US 2004/0056689 A1 Mar. 25, 2004

(51) Int. Cl.[7] .............................. H03F 3/60; H03F 3/68
(52) U.S. Cl. ...................................... 330/286; 330/295
(58) Field of Search ............................ 330/53, 54, 57, 330/286, 295

(56) References Cited

U.S. PATENT DOCUMENTS 6,377,125 B1 * 4/2002 Pavio et al. ................ 330/286

* cited by examiner

Primary Examiner—Steven J. Mottola

(57) ABSTRACT

A structure and method for the improvement of interference isolation using distributed broadband technology. This structure uses signal processing across a distributed network in order to optimize the isolation of a signal of interest when noise, interference and crosstalk signal sources are present. The structure is designed so that a signal arrives at a node in the network via more than one path and is summed in a correlated or in-phase manner. Each signal path is designed so that the signal phase may be modulated to create the in-phase summing. Noise sources that arrive at the network node are added in an uncorrelated or out-of-phase manner. Therefore, the combination of the signal adding coherently and the interference adding with an uncorrelated phase improves the signal to interference ratio. This type of structure may be applied in an RF power amplifier application in order to provide an improved interference or crosstalk signal ratio.

23 Claims, 3 Drawing Sheets

METHOD AND STRUCTURE FOR INTEGRATED CIRCUIT INTERFERENCE ISOLATION ENHANCEMENT

TECHNICAL FIELD

This invention relates generally to the field of electronic circuits and more specifically to the use of distributed broadband technology for interference isolation enhancement.

BACKGROUND OF THE INVENTION

Electrical circuits, which are in close physical proximity and which must share common supply, ground, and substrate connections, can cause the associated electrical signals of those circuits to become difficult to isolate. The difficulty in signal isolation is caused by electromagnetic interference (EMI). EMI is often caused by high frequency components that radiate electromagnetic energy (the system clock is an example). EMI is also affected by the propagation mode of electrical signals within a circuit. Differential mode signals, in which two signals carry current in opposite directions, are less susceptible to EMI than common mode signals. Common mode signals cause more significant EMI issues because the signal current flows in one direction, and the conductors in the signal path can generate unwanted capacitances or inductances that degrade the signal quality in the primary signal path as well as nearby signal paths.

Common EMI mitigation strategies include reducing the power level of potential noise sources as much as possible, minimizing the amount of coupling between signals of interest (SOI) and EMI generating components, and filtering EMI components. Reducing the power level is a nice solution but is not practical in many design situations, and filtering 'noisy' components complicates the design process and increases overall component cost.

There are several design approaches that may be used to mitigate the effects of signal distortion due to coupling from the noise contributions of other components in the integrated circuit. Some commonly applied mitigation techniques include grounding, shielding, and guard ring isolation. Grounding, filtering and shielding are commonly used techniques that can significantly reduce spurious emissions, and improve signal isolation. However, filtering, guard ring isolation, and shielding all require additional electronics components, complicate the design process, and increase the production cost of IC electronics.

Another commonly used technique in the design of small integrated circuit electronics is the use of common circuit partitioning. Since the circuits in close proximity tend to interfere with each other at frequencies of interest, physical separation of interfering circuits is used to reduce these noise effects. These undesired noise contributions can become a system complexity factor used to determine the partitioning of common circuits on a single integrated component. For example, direct current (DC)-to-DC converters are considered noise interference generators that should not be integrated with radio frequency (RF) power amplifier circuits on a common component. However, DC-to-DC converters are an important solution for the issue of battery life efficiency enhancement and this partitioning constraint has unfortunate design implications.

In light of the foregoing, there is an unmet need in the art for a method and structure that provides enhanced signal isolation capabilities while allowing DC signal circuitry to be integrated with RF power amplification circuits. There is a further need in the art for an integrated circuit design technique that allows noise interference generators to be placed in close proximity to RF amplification components, thereby reducing potential crosstalk with other integrated circuit components.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

Figure 1:
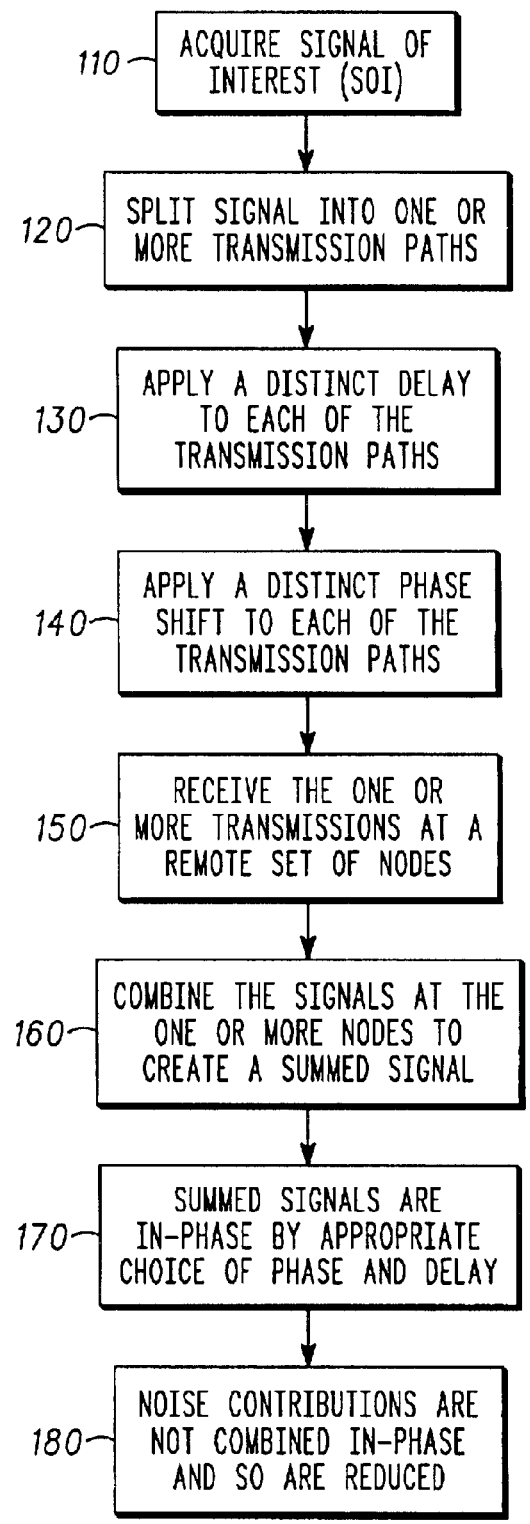
FIG. 1, is a block diagram of a signal isolation technique, according to an embodiment of the present invention.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

One approach to signal isolation using partitioned common circuits uses DC-to-DC converters that are implemented within power management integration components for applications across an entire product portfolio. This partitioning is designed to aid in isolating the DC-to-DC converter interference from RF power amplifier integrated platform components. The result of this partitioning is a general DC-to-DC converter design intended to apply across all variations of RF power amplifier applications, to the extent that this may be achieved in a frequency and power limited integration technology. The result would be a low cost supply modulation efficiency enhancement technology that would be applied at the product level rather than across all products. Restricting the DC-to-DC converter within the RF power amplifier integration would be a reduction in interconnection and potential crosstalk to other transceiver circuits as well.

The intended signal is processed across a distributed network in a correlated manner to optimize in-phase summing at multiple nodes. Noise, interference, and crosstalk signal sources originating from the supply or ground terminal will process un-correlated or out-of-phase at the summing nodes.

Referring now to FIG. 1, a block diagram of the method of interference isolation 100 of the present invention is shown according to an embodiment of the present invention. A signal of interest (SOI) is acquired 110, and this signal is then split into one or more transmission paths 120. Each transmission path has a delay and a phase offset associated with it, and these delays and phase offsets are applied to the SOI for each transmission path (130 and 140). At a remote set of nodes, the one or more transmission paths terminate 150 and the signal received on each transmission path is summed together 160 to create a received signal. The received signal contains a sum of in-phase components of the SOI. Each of these in-phase components is created by the appropriate selection of the delay and phase for each transmission line 170. Conversely, the noise contributions typically occur over a broad range of frequencies, including the SOI frequency. These noise contributions are also affected by the phase and delay of each transmission path; however, these noise contributions do not add in-phase at the remote set of nodes. This is a result of the phase shift or delay difference in the signal paths of the noise signal compared to the SOI signals. Since the circuit node or branch associated with the noise signal source is different from the SOI signal, the phase shift or delay to the common-summed output nodes are designed to reject the noise combining process without affecting the SOI signal processing. The net result is that the SOI is enhanced and the noise is reduced in a joint manner, as shown in Block 180.

Figure 2:
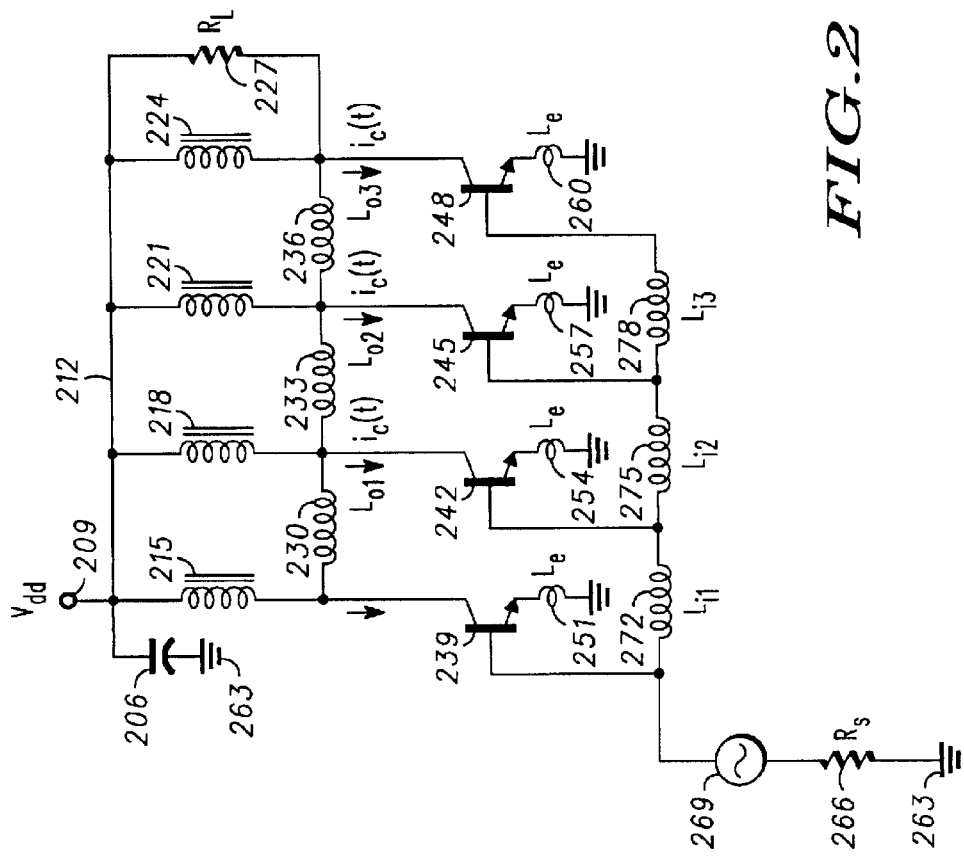
FIG. 2 is a circuit diagram of technology applicable to a RF power amplifier application, according to an embodiment of the present invention.

Referring now to FIG. 2, a circuit diagram 200 of distributed broadband technology applied to an RF power amplifier implementation of the interference isolation technique according to an embodiment of the present invention is shown. Distributed broadband technology incorporates shunt reactive device parasitics into an artificial transmission line structure, thereby improving the frequency limiting function from a narrow band parallel resonant to that of an broadband artificial transmission line. A signal of interest (SOI) is generated by a signal generator 269 coupled to ground 263 through resistive element 266. The SOI is coupled to four transmission paths through the use of inductive elements. The output of signal generator 269 is coupled to the first terminal of inductive element LI1 272 and the base of transistive element T1 239. The first transmission path is the input to the base of transistive element T1 239. The second transmission path is formed by coupling a second terminal of inductive element 272 to the base of transistive element T2 242. The third transmission path is formed by coupling the second terminal of inductive element 272 with a first input terminal of inductive element 275. The output of inductive element 275 is coupled to the base of a third transistive element 245. The fourth transmission path is formed by coupling the second terminal of inductive element 275 with a first input terminal of inductive element 278. The output of inductive element 278 is coupled to the base of a fourth transistive element 248.

Each emitter terminal of the four transistive elements is coupled to ground through an inductive element. The emitter of transistive element 239 is coupled to ground 263 through inductive element 251. The emitter of transistive element 242 is coupled to ground 263 through inductive element 254. The emitter of transistive element 245 is coupled to ground 263 through inductive element 257. The emitter of transistive element 248 is coupled to ground 263 through inductive element 260.

The collector of each transistive element is coupled to an output node through a magnetic inductive element. The output of the collector terminal of transistive element 239 is coupled to a supply voltage 209 through magnetic inductive element 215. The output of the collector terminal of transistive element 242 is coupled to a supply voltage 209 through magnetic inductive element 218. The output of the collector terminal of transistive element 245 is coupled to a supply voltage 209 through magnetic inductive element 221. The output of the collector terminal of transistive element 248 is coupled to a supply voltage 209 through magnetic inductive element 224.

In addition to coupling to supply voltage 209, each collector terminal is coupled to the nearest collector terminals: Collector terminal of transistive element 239 is coupled to the collector terminal of transistive element 242. Collector terminal of transistive element 242 is coupled to the collector terminal of transistive element 245. Collector terminal of transistive element 245 is coupled to the collector terminal of transistive element 248. A load resistor 227 is then coupled to the collector terminal of transistive element 248 via a first terminal, and coupled to the supply voltage 209 via a second terminal. The first terminal of load resistor 227 is also coupled to ground 263 via a bypass capacitive element 206.

FIG. 2 shows distributed broadband technology applied to an RF power amplifier, where the single ended final device is divided into four equivalent power handling devices. The shunt parasitic of each smaller device is reduced by a factor of four. Input base terminals of transistive elements (239, 242, 245, and 248) are connected with inductors (272, 275, 278) in combination with the device shunt parasitics (251, 254, 257, and 260) to form an input artificial transmission line. Output collector terminals of transistive elements (239, 242, 245, and 248) are connected in a similar manner with series inductors (230, 233, 236) and the shunt collector capacitances (215, 218, 221, 224, 206) to form an output artificial transmission line with an operating frequency delay relative to the input delay for in-phase or coherent signal combining at the individual collector output nodes.

Also shown in FIG. 2 is the parasitic inductance (251, 254, 257, and 260) associated with the individual emitter connections to the integrated substrate ground. Devices in a very close location to each other will have substrate induced signals applied with essentially the same phase into each of the devices. At interference or crosstalk frequencies different from the desired signal, the summed nodes will have un-correlated interference signals. The result will be an improvement in the desired to interference or crosstalk signal ratio as a result of the correlated desired signal summing compared to the un-correlated interference or crosstalk signal summing. In an alternate embodiment of the present invention, this can be extended to the supply interference or crosstalk with the use of individual supply choke connections to each of the distributed device collectors of transistive elements (239, 242, 245, 248).

There are some degrees of freedom in the distributed design delays to enhance the un-correlated rejection that will be a function out-of-phase value at each of the summing nodes. In an alternative embodiment of the present invention, this interference isolation technique can be implemented on single ended or differential distributed circuits taking advantage of common mode rejection.

It is noted that one of skill in the art will realize that ground 263 need not be the same for each ground terminal shown in FIG. 2. It is further noted that although inductors have been shown in FIG. 2, other types of coupled elements could be used without departing from the spirit and scope of the present invention. It is also noted that while the circuit diagram of FIG. 2 is a preferred embodiment of the present invention, other applications of the interference isolation technique disclosed herein are possible. Other potential applications include, but are not limited to, any interference or crosstalk circuit can be implemented with a distributed configuration where the desired signal is summed in phase and interference contributions are summed out-of-phase. In these applications, the amount of interference rejection is a function of phase offset value.

If the SOI is represented as an exponential sinusoidal signal with amplitude $A_i$, frequency w(t) and phase $\theta_i(t)$:

$$V_{gi} = A_i \theta^{j(w(t)+\theta_i(t))}$$

then, in an exemplary embodiment of the present invention, the input stage consisting of inductive elements 272, 275, 278 and the base capacitances consisting of transistive elements 251, 254, 257, 260 establish magnitudes equal to $A_i$ at the base of transistive elements 251, 254, 257, 260. The phase shift at transistive element 239 is the input phase difference $\theta_{g1}(t)=\theta_1(t)-\theta(t)$, where $\theta_1(t)$ is the phase at the input to inductive element 272. The phase shift at transistive element 242 is $\theta_{g2}(t)=\theta_1(t)-\theta_2(t)$, where $\theta_2(t)$ is the phase at the input to inductive element 275. The phase shift at transistive element 245 is $\theta_{g3}(t)=\theta_2(t)-\theta_3(t)$, where $\theta_3(t)$ is the phase at the input to inductive element 278. The phase shift at transistive element 248 is $\theta_{g4}(t)=\theta_3(t)-\theta_4(t)$, where $\theta_4(t)$ is the phase at the output of inductive element 278. Since $V_{gi}$ is a function of the input phase shifts $\theta_{g1}(t)$, $\theta_{g2}(t)$, $\theta_{g3}(t)$, $\theta_{g4}(t)$, these input phase shifts may be related to the collector terminal of transistive elements 239, 242, 245, and 248 by the relation $$I_i = g_{mi} V_{gi}$$

where $g_{mi}$ is the transconductance of transistive devices 239, 242, 245, and 248. The value of $g_{mi}$ for each transistive device 239, 242, 245, 248 is assumed equal, although one of ordinary skill in the art will realize that the transconductance values of transistive devices 239, 242, 245, 248 could be different without departing from the spirit and scope of the present invention.

Figure 3:
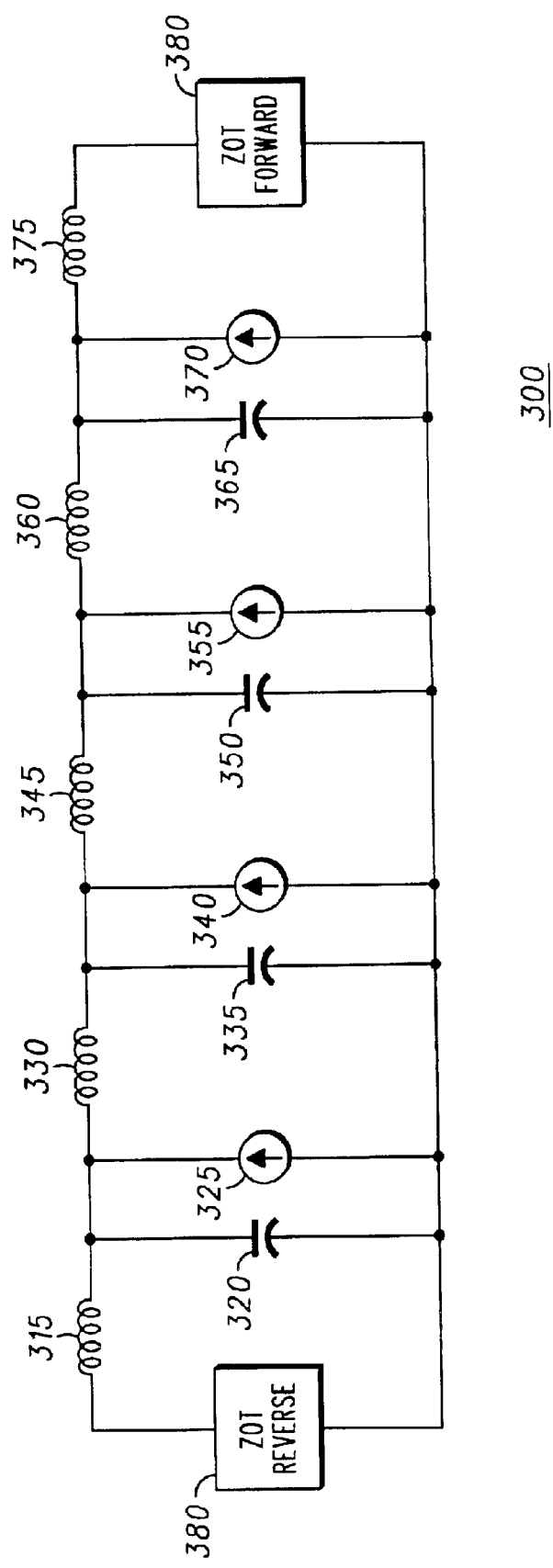
FIG. 3 is an equivalent circuit diagram of the RF power amplifier application, according to an embodiment of the present invention.

Using this current relation, the simplified circuit of FIG. 3 has identical input-output behavior to the circuit of FIG. 2.

Referring now to FIG. 3, the capacitances of elements 320, 335, 350, and 365 are each a combination of the corresponding device collector capacitance of transistive elements 239, 242, 245, and 248 and a discrete capacitance component, thereby forming a lumped transmission line network with corresponding inductive outputs 315, 330, 345, 360, and 375. The $Z_{oti}$ reverse impedance 310 represents the reverse wave load impedance of the RF power amplifier circuit 200, while $Z_{oti}$ forward 380 represents the effective impedance of the output stage of RF power amplifier circuit 200.

Note that if superposition is used to examine the output power of equivalent circuit 300, then the voltage developed across impedance element $Z_{oti}$ 380 is given by:

$$V_{out} = \frac{1}{2}\sqrt{\frac{L}{C}} \cdot e^{-\theta/2} \cdot \sum_{i=1}^{N} I_i e^{-\theta(N-t)}$$

It is further assumed in this particular exemplary embodiment that the phase difference $\theta_d$ is equal between each inductive element (315, 330, 345, 360, 375). The phase shift $\theta_{dx}$ is equal to the phase shift of the corresponding section input phase shift $\theta_{gi}$ at SOI, which assumes that the transister phase shifts are equal. In the case of equal phase differences, $\theta_d$, the normalized output voltage becomes:

$$V_{out} = \frac{A_i g_m}{2} \cdot Z_{ot} e^{(\theta_g - \theta_d)} e^{-N\theta_d} \sum_{i=1}^{N} e^{i(\theta_d - \theta_g)}$$

Assuming in-phase combining at the SOI, in the preferred embodiment of the present invention, the output phase difference $\theta_d$ across each inductive element (315, 330, 345, 360, 375) is equal to the corresponding input phase difference ($\theta_{g1}(t)$, $\theta_{g2}(t)$, $\theta_{g3}(t)$, $\theta_{g4}(t)$) associated with each inter-device coupling section at the SOI frequency, then the output voltage is $$V_{out} = \frac{A_i g_m}{2} Z_{ot} e^{-N\theta_d}$$

Note that in an alternative embodiment, the coupling sections have non-equal phase shift, the expression for $V_{out}$ is similar with the sum of the individual phase shifts replacing the term $-N\theta_d$.

It is noted that the simplified circuit of FIG. 3, is an exemplary embodiment of the present invention, and one of ordinary skill in the art will recognize that other embodiments are possible without departing from the spirit and scope of the present invention.

A noise signal originating at a device ground or supply terminal will share a portion of this distributed network of FIG. 2 and the associated phase shift. The simplified circuit of FIG. 3 provides a set of analytical expressions to design non-coherent noise signal processing to the $V_{out}$ node coupled to impedance element 380 and inductive element 375 without affecting the coherent SOI signal processing. Note that one of ordinary skill in the art will recognize that this exemplary embodiment can be extended to alternative device technology such as Field Effect Transistors (FET) and amplifier configurations such as common gate, base, collector, drain, cascode, and cascade without departing from the spirit and scope of the present invention.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A method for signal isolation in electronic circuits, further comprising:

acquiring a signal of interest (SOI) at a local node;

coupling the SOI to a plurality of transmission paths, wherein each transmission path of the plurality of transmission paths has a phase and a delay distinct from others of the plurality of transmission paths;

setting the delay and phase of each transmission path of the plurality of transmission paths; and combining the plurality of transmission paths at a remote node, wherein a signal at the remote node is created by summing a plurality of signals received on the plurality of transmission paths, said summation occurring in an in-phase manner in accordance with the selection of the delay and phase of each transmission path of the plurality of transmission paths, wherein the phase and delay of each transmission path are chosen to optimize an out-of-phase addition of a plurality at induced noise contributions that are essentially in-phase on the corresponding plurality of transmission paths.

2. The method of claim 1, wherein the electronic circuit is an integrated circuit.

3. The method of claim 1, wherein the electronic circuit is implemented using distributed broadband technology.

4. The method of claim 1, wherein the plurality of delays corresponding to the plurality of transmission paths are set according to predetermined values.

5. The method of claim 1, wherein the plurality of phases corresponding to the plurality of transmission paths are set according to predetermined values.

6. The method of claim 1, wherein the plurality of phases corresponding to the plurality of transmission paths are equal.

7. The method of claim 1, wherein the plurality of corresponding phased signals have the same amplitude.

8. The method of claim 1, wherein the plurality of delays corresponding to the plurality of transmission paths are determined by the length of the plurality of transmission paths.

9. A structure for signal isolation in electronic circuits, comprising:
   a first node of a plurality of nodes of an input stage, said first node operable to receive a signal of interest (SOI);
   the first node of the input stage coupled to a plurality of nodes of the plurality of nodes through a plurality of corresponding coupled elements, thereby creating a plurality of corresponding phased signals corresponding to the SOI;
   each node of the plurality of nodes coupled to a plurality of transistive elements, said plurality of transistive elements operable to create a plurality of output signals at an output stage, said plurality of output signals proportional to the plurality of corresponding phased signals;
   a plurality of remote nodes at the output stage coupled to the plurality of translative elements, wherein the plurality of remote nodes is operable to receive an output signal; and
   a plurality of additive elements coupled to the plurality of remote nodes, wherein the plurality of remote nodes are combined by the plurality of additive elements to create a destination signal, said destination signal created by summing the plurality of corresponding phased signals in an in-phase manner, wherein each of the plurality of transistive elements is associated with an inductive element that couples an induced noise signal into the transistive element, and wherein the induced noise signals coupled into the plurality of transistive elements have essentially the same phase, and wherein the plurality of coupled elements, the plurality of additive elements, and the plurality of inductive elements are chosen to optimize an out-of phase addition of the induced noise signals.

10. The structure of claim 9, wherein the structure is implemented using distributed broadband technology.

11. The structure of claim 9, wherein the plurality of corresponding phased signals have the same amplitude.

12. The structure of claim 9, wherein each phase shift of the plurality of corresponding coupled elements are the same.

13. The structure of claim 9, wherein the input stage and output stage are components of an RF power amplifier application.

14. The structure of claim 9, wherein each coupled element of the plurality of coupled elements is one of an inductor and a capacitor.

15. The structure of claim 9, wherein the use of the plurality of coupled elements creates an artificial transmission line at the input stage.

16. The structure of claim 9, wherein the plurality of additive elements apply an equal phase shift to a signal input to the plurality of additive elements.

17. The structure of claim 9, wherein the plurality of remote nodes are coupled to a plurality of inductive elements, wherein the plurality of corresponding inductive elements are operable to couple a first node of the plurality of remote nodes with a second node of the plurality of remote nodes.

18. The structure of claim 17, wherein the plurality of remote nodes are further coupled to a first terminal of a plurality of corresponding power handling devices, said power handling devices identical to the plurality of additive elements.

19. The structure of claim 18, wherein a second terminal of the plurality of power handling devices are operable to be combined to create the destination signal.

20. The structure of claim 19, wherein the destination signal is realized using a bridge-tee element coupled to the second terminal of the plurality of additive elements.

21. The method according to claim 1, wherein a noise contribution on each transmission path is one of the plurality of noise contributions and is one of a substrate induced noise and a power supply induced noise.

22. The structure according to claim 9, wherein the induced noise signal is a substrate induced noise signal.

23. The structure according to claim 9, wherein the induced noise signal is a power supply induced noise signal.

* * * * *

UNITED STATES PATENT AND TRADEMARK OFFICE
CERTIFICATE OF CORRECTION

PATENT NO.        : 6,819,181 B2
APPLICATION NO. : 10/036550
DATED             : November 16, 2004
INVENTOR(S)       : Stengel et al.

It is certified that error appears in the above-identified patent and that said Letters Patent is hereby corrected as shown below:

Col. 6, Line 48 should read
1. A method for signal isolation in electronic circuits, further comprising:
 acquiring a signal of interest (SOI) at a local node;
 coupling the SOI to a plurality of transmission paths, wherein each transmission path of the plurality of transmission paths has a phase and a delay distinct from others of the plurality of transmission paths; setting the delay and phase of each transmission path of the plurality of transmission paths; and
 combining the plurality of transmission paths at a remote node, wherein a signal at the remote node is created by summing a plurality of signals received on the plurality of transmission paths, said summation occurring in an in-phase manner in accordance with the selection of the delay and phase of each transmission path of the plurality of transmission paths, wherein the phase and delay of each transmission path are chosen to optimize an out-of-phase addition of a plurality of induced noise contributions that are essentially in-phase on the corresponding plurality of transmission paths.

Col. 8, Line 9 should read
12. A structure for signal isolation in electronic circuits, comprising:
 a first node of a plurality of nodes of an input stage, said first node operable to receive a signal of interest (SOI);
 the first node of the input stage coupled to a plurality of nodes of the plurality of nodes through a plurality of corresponding coupled elements, thereby creating a plurality of corresponding phased signals corresponding to the SOI;
 each node of the plurality of nodes coupled to a plurality of transistive elements, said plurality of transistive elements operable to create a plurality of output signals at an output stage, said plurality of output signals proportional to the plurality of corresponding phased signals;
 a plurality of remote nodes at the output stage coupled to the plurality of transistive

UNITED STATES PATENT AND TRADEMARK OFFICE
CERTIFICATE OF CORRECTION

| | |
|---|---|
| PATENT NO. | : 6,819,181 B2 |
| APPLICATION NO. | : 10/036550 |
| DATED | : November 16, 2004 |
| INVENTOR(S) | : Stengel et al. |

It is certified that error appears in the above-identified patent and that said Letters Patent is hereby corrected as shown below:

Col. 8, Line 9 should read (cont'd)
     a plurality of additive elements coupled to the plurality of remote nodes, wherein the plurality of remote nodes are combined by the plurality of additive elements to create a destination signal, said destination signal created by summing the plurality of corresponding phased signals in an in-phase manner, wherein each of the plurality of transistive elements is associated with an inductive element that couples an induced noise signal into the transistive element, and wherein the induced noise signals coupled into the plurality of transistive elements have essentially the same phase, and wherein the plurality of coupled elements, the plurality of additive elements, and the plurality of inductive elements are chosen to optimize an out-of phase addition of the induced noise signals.

Signed and Sealed this

Second Day of October, 2007

JON W. DUDAS
*Director of the United States Patent and Trademark Office*